(12) United States Patent
Stevenson et al.

(10) Patent No.: US 7,123,109 B2
(45) Date of Patent: Oct. 17, 2006

(54) CRYSTAL OSCILLATOR WITH VARIABLE BIAS GENERATOR AND VARIABLE LOOP FILTER

(75) Inventors: Paul E. Stevenson, Colorado Springs, CO (US); Jon E. Tourville, Colorado Springs, CO (US); Nathan L. Pihlstrom, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 11/013,059

(22) Filed: Dec. 15, 2004

(65) Prior Publication Data

US 2006/0139104 A1 Jun. 29, 2006

(51) Int. Cl.
- H03B 5/36 (2006.01)
- H03L 3/00 (2006.01)
- H03L 5/00 (2006.01)

(52) U.S. Cl. .............................. 331/109; 331/116 FE; 331/158; 331/186

(58) Field of Classification Search ................ 331/109, 331/116 R, 116 FE, 116 M, 158–159, 175, 331/183–186
See application file for complete search history.

(56) References Cited

U.S. PATENT DOCUMENTS

| | | | | |
|---|---|---|---|---|
| 4,039,973 A * | 8/1977 | Yamashiro | ............. | 331/116 FE |
| 4,282,496 A * | 8/1981 | Heuner | ................. | 331/116 FE |
| 4,307,354 A * | 12/1981 | Miyagawa et al. | .... | 331/116 FE |
| 4,328,571 A * | 5/1982 | Noble | ......................... | 368/87 |
| 4,387,349 A * | 6/1983 | Rapp | .................... | 331/116 FE |
| 4,387,350 A * | 6/1983 | Bessolo et al. | ........ | 331/116 FE |
| 4,613,829 A * | 9/1986 | Ott | .............................. | 331/59 |
| 4,615,625 A * | 10/1986 | Moriya | ....................... | 368/156 |
| 4,783,620 A * | 11/1988 | Kitagawa et al. | ........... | 323/313 |
| 4,896,122 A * | 1/1990 | Tahernia et al. | ............ | 331/158 |
| 4,918,408 A * | 4/1990 | Sakihama et al. | ...... | 331/116 R |
| 4,956,618 A * | 9/1990 | Ulmer | ................... | 331/116 FE |
| 5,041,802 A * | 8/1991 | Wei et al. | ............... | 331/116 FE |
| 5,208,558 A * | 5/1993 | Shigehara et al. | ..... | 331/116 FE |
| 5,557,243 A * | 9/1996 | Ho | ............................. | 331/158 |
| 5,719,534 A * | 2/1998 | Imura | ......................... | 331/186 |
| 5,770,980 A * | 6/1998 | Barrett et al. | .......... | 331/116 FE |
| 5,834,982 A * | 11/1998 | Watanabe et al. | ........... | 331/109 |
| 5,909,152 A * | 6/1999 | Li et al. | ................. | 331/116 FE |
| 5,982,246 A * | 11/1999 | Hofhine et al. | ........ | 331/116 FE |
| 6,025,757 A * | 2/2000 | Tsukagoshi et al. | ........ | 331/158 |
| 6,118,348 A * | 9/2000 | Narahara | ............... | 331/116 FE |
| 6,133,801 A * | 10/2000 | Tanaka | ...................... | 331/158 |
| 6,166,609 A * | 12/2000 | Nakamiya et al. | .......... | 331/109 |
| 6,172,575 B1 * | 1/2001 | Shinmori | ............... | 331/116 FE |
| 6,191,662 B1 * | 2/2001 | Volk | ........................... | 331/158 |
| 6,278,338 B1 * | 8/2001 | Jansson | ................ | 331/116 FE |
| 6,670,860 B1 * | 12/2003 | Kobayashi et al. | ......... | 331/158 |
| 6,717,483 B1 * | 4/2004 | Nehoran et al. | ............ | 331/158 |
| 6,727,769 B1 * | 4/2004 | Aihara et al. | ............... | 331/158 |
| 6,861,917 B1 | 3/2005 | Stevenson et al. | | |

(Continued)

OTHER PUBLICATIONS

Vittoz, Eric A., "High-Performance Crystal Oscillator Circuits: Theory and Application", *IEEE Journal of Solid-State Circuits*, vol. 23, No. 3, Jun. 1998, pp. 774-783.

*Primary Examiner*—David Mis
(74) *Attorney, Agent, or Firm*—LeMoine Patent Services, PLLC

(57) ABSTRACT

An oscillator circuit may be operated in a high power mode or a reduced power mode. The high power mode provides fast start-up of the oscillator circuit.

25 Claims, 5 Drawing Sheets

U.S. PATENT DOCUMENTS 6,888,418 B1 * 5/2005 Yin .............................. 331/158
6,903,616 B1 * 6/2005 Yin et al. ...................... 331/57
7,009,460 B1 * 3/2006 Wilcox ........................ 331/173

* cited by examiner

CRYSTAL OSCILLATOR WITH VARIABLE BIAS GENERATOR AND VARIABLE LOOP FILTER

FIELD

The present invention relates to oscillator circuits, and more specifically to crystal oscillator circuits.

BACKGROUND

Oscillator circuits are useful to create oscillating signals. In general, low power crystal oscillator circuits may take a substantial period of time to begin oscillating with an amplitude sufficiently large to be useful. Start-up time can be reduced, but it may be at the expense of increased power consumption.

DESCRIPTION OF EMBODIMENTS

Figure 1:
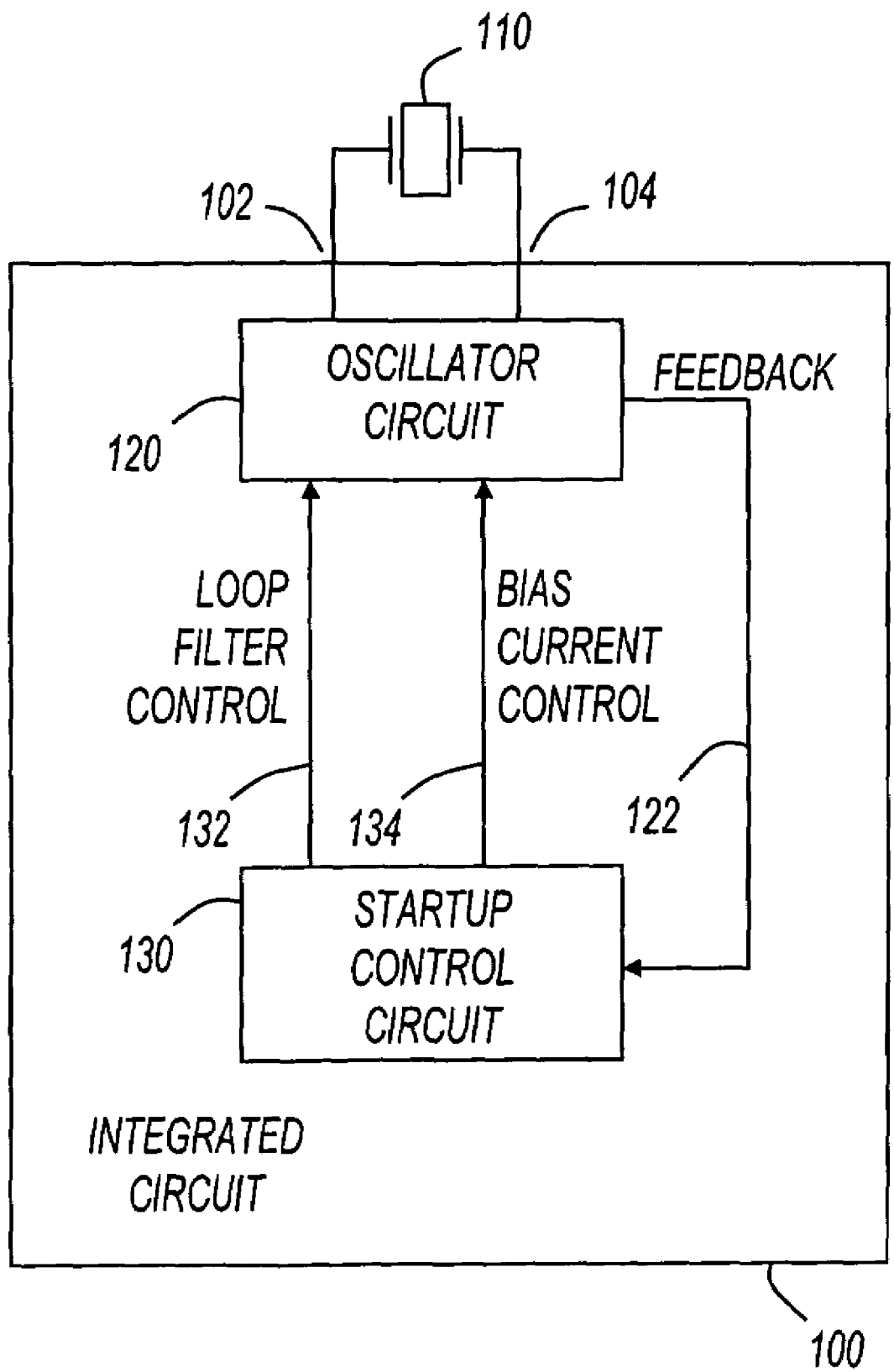
FIG. 1 shows a diagram of an integrated circuit and a crystal.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of an integrated circuit and a crystal. Crystal 110 may be any type of material having a resonant frequency. For example, crystal 110 may be a crystal resonator having one or more oscillation modes with different mechanical oscillation frequencies. Any type of resonator may be utilized in place of crystal 110 without departing from the scope of the present invention.

Integrated circuit 100 includes oscillator circuit 120 and start-up control circuit 130. Integrated circuit 100 also includes electrical contacts 102 and 104 at which oscillator circuit 120 is coupled to crystal 110. Oscillator circuit 120 senses the oscillations of crystal 110 and amplifies them to provide an oscillation signal of sufficient amplitude to be useful to integrated circuit 100. For example, oscillator circuit 120 may provide a clock signal (not shown) having an amplitude suitable to drive logic circuits (not shown) within integrated circuit 100.

Integrated circuit 100 may be any type of integrated circuit that includes an oscillator circuit. For example, in some embodiments, integrated circuit 100 may be a microprocessor, a digital signal processor, an embedded processor, a microcontroller, a system on a chip, or the like. In other embodiments, integrated circuit 100 may be limited to oscillator circuitry and associated peripheral circuitry. Further, integrated circuit 100 may include many circuits and functional blocks in addition to those shown in FIG. 1 without departing from the scope of the present invention. For example, integrated circuit 100 may include an arithmetic logic unit (ALU), a volatile or nonvolatile memory, a graphics processor, or the like.

Start-up control circuit 130 provides various control signals to, and receives feedback from, oscillator circuit 120. For example, start-up control circuit 130 provides one or more loop filter control signals on node 132 and also provides one or more bias current control signals on node 134. The signals provided to oscillator circuit 120 from start-up control circuit 130 may be utilized to control an operating mode of oscillator circuit 120. For example, by controlling a bias current, start-up control circuit 130 may cause oscillator circuit 120 to operate in a low power mode or a high power mode. Further, loop filter control signals on node 132 may be utilized to vary loop filter characteristics within oscillator circuit 120.

Oscillator circuit 120 may be started as a result of a "start-up event." Examples of start-up events include the application of power to integrated circuit 100 (e.g., turning on a power switch), awaking from a sleep mode, or the like. When starting, oscillator circuit 120 may be put into a start-up mode by start-up control circuit 130. Oscillator circuit 120 may be considered as "started" when an operating condition is met. For example, operating conditions may include a time of operation or the oscillation amplitude reaching a predetermined level.

In some embodiments, oscillator circuit 120 may be put in a high power start-up mode as a result of start-up event to allow the oscillator to start quickly. Further, oscillator circuit 120 may be put in a reduced power operating mode when an operating condition is met. The combination of modes allows the oscillator circuit to start quickly and to operate over a long period of time with reduced power consumption.

In some embodiments, start-up control circuit 130 receives feedback from oscillator circuit 120 on node 122, and modifies loop filter control signals and bias current control signals in response. For example, in some embodiments, the feedback on node 122 may provide an indication of the oscillation amplitude of oscillator circuit 120, and start-up control circuit 130 may include circuitry to determine when that amplitude is sufficiently large to change the mode of operation. Further, in some embodiments, start-up control circuit 130 may modify loop filter control signals and bias current control signals after oscillator circuit 120 has been operating for a predetermined amount of time.

Start-up control circuit 130 may include any type of circuitry capable of receiving feedback from, and providing signals to, oscillator circuit 120. For example, start-up control circuit 130 may include digital circuits such as counters, latches, registers, state machines, or the like. Also for example, start-up control circuit 130 may include analog circuits such as amplitude detectors, envelope detectors, comparators, operational amplifiers, or the like.

Figure 2:
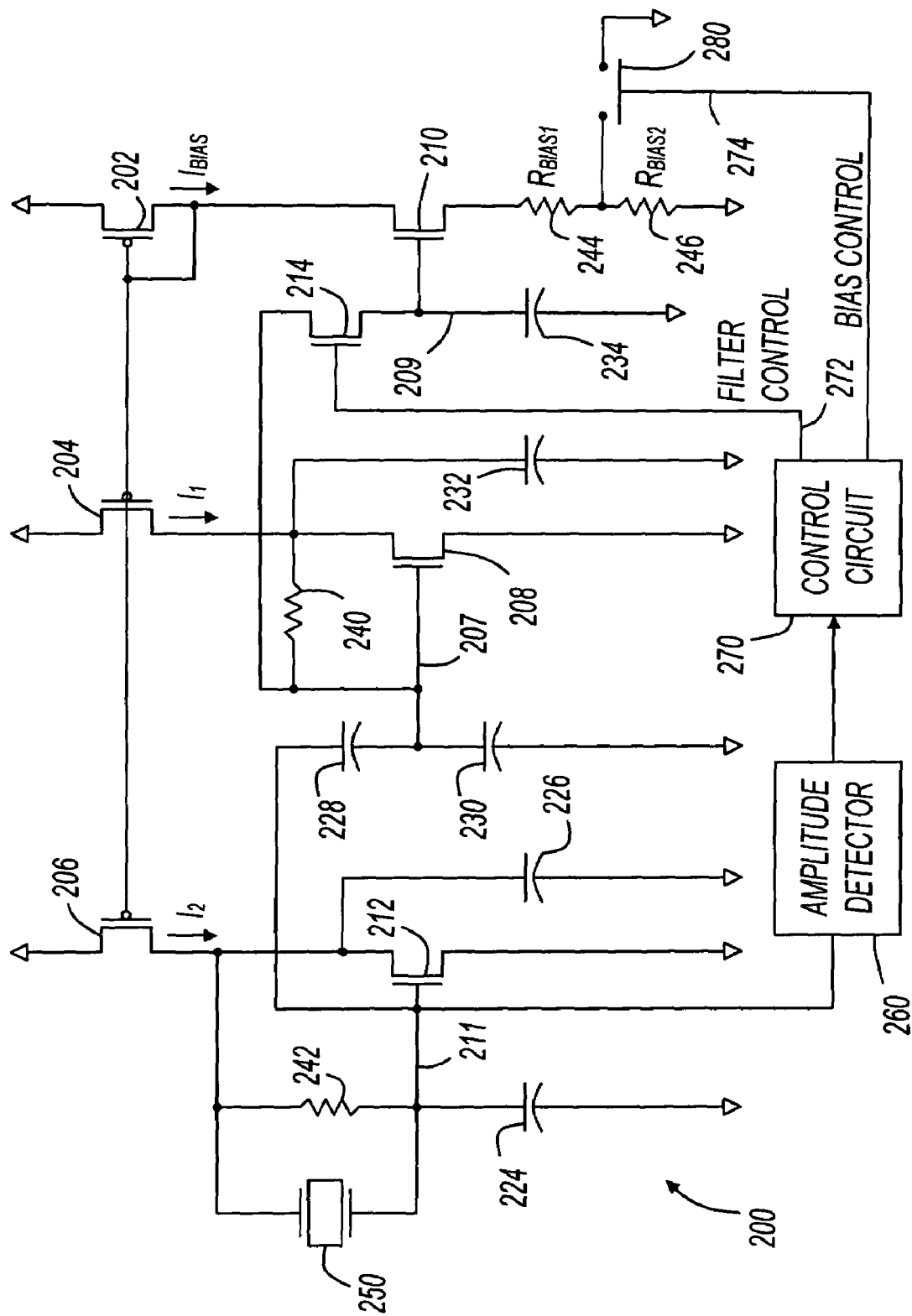
FIGS. 2 and 3 show crystal oscillator circuits in accordance with various embodiments of the present invention.

FIG. 2 shows a crystal oscillator circuit in accordance with various embodiments of the present invention. Crystal oscillator circuit 200 includes transistors 202, 204, 206, 208, 210, 212, and 214; capacitors 224, 226, 228, 230, 232, and 234; and resistors 240, 242, 244, and 246. Also shown in FIG. 2 are amplitude detector 260, control circuit 270, switch 280, and crystal 250.

The transistors in FIG. 2 and later figures are shown as isolated gate transistors, and specifically as metal oxide semiconductor field effect transistors (MOSFETs). For example, transistors 202, 204, and 206 are shown as P-type MOSFETs, and the remaining transistors are shown as N-type MOSFETs. Other types of switching or amplifying elements may be utilized for the various transistors of oscillator circuit 200 without departing from the scope of the present invention. For example, the transistors of circuit 200 may be junction field effect transistors (JFETs), bipolar junction transistors (BJTs), or any device capable of performing as described herein.

Transistors 204, 208, 202, and 210, and resistors 244 and 246 combine to form a bias current generator that generates a selectable bias current shown as $I_{BIAS}$ in FIG. 2. Associated with these transistors are two resistor-capacitor (RC) networks. Resistor 240 and capacitor 232 combine to form a first RC network, and transistor 214 and capacitor 234 combine to form a second RC network where the resistance of the RC network is provided by the drain-to-source resistance of transistor 214. The resistance of transistor 214 may be controlled by the filter control signal on node 272, thereby modifying the time constant of the RC network. For example, when a high voltage is presented on node 272 by control circuit 270, the drain-to-source resistance of transistor 214 is relatively small, and capacitor 234 may charge fairly quickly. Also for example, when a lower voltage is presented on node 272, the drain-to-source resistance of transistor 214 is increased and the time constant of the RC network is correspondingly increased.

The current $I_{BIAS}$ is mirrored through transistor 204 to create $I_1$, and is also mirrored through transistor 206 to create $I_2$. Current $I_1$ is provided to transistor 208, and node 207 receives a direct current (DC) voltage as a result of resistor 240 being coupled drain-to-gate on transistor 208. Current $I_2$ is provided to transistor 212, which is coupled as a gain element to amplify oscillations of crystal 250. The gain of transistor 212 increases with increased $I_2$, as does the power dissipation of circuit 200.

Crystal 250 is coupled between the gate node and drain node of transistor 212, and as the oscillations grow in amplitude, an alternating current (AC) signal appears on the gate of transistor 212. Capacitors 228 and 230 form a capacitive voltage divider that divides the AC voltage present on node 211 to provide an AC voltage component on node 207. The AC voltage component on node 207 is proportional to the amplitude of the crystal's oscillation. As the oscillation amplitude grows, the DC voltage on the drain of transistor 208 drops in proportion to the increase in oscillation amplitude.

As the voltage on the drain of transistor 208 drops as a result of the oscillation amplitude increasing, the voltage on the gate of transistor 210 will also drop, thereby reducing $I_{BIAS}$. Accordingly, transistor 214 and capacitor 234 form a loop filter in an amplitude regulation feedback loop. As the oscillation amplitude increases, $I_{BIAS}$ decreases, which reduces $I_2$ and reduces the oscillation amplitude.

During operation, a long time constant for the loop filter (transistor 214 and capacitor 234) can prevent the feedback loop from becoming unstable. The time constant may be held high by controlling transistor 214 to provide a relatively high resistance, but when transistor 214 provides a high resistance, it may take a long time for node 209 to initially charge up when the oscillator circuit is started.

In various embodiments of the present invention, control circuit 270 drives a high voltage on node 272 to reduce the time constant of the loop filter during start-up of the oscillator circuit. By reducing the time constant of the loop filter during start-up, node 209 may charge faster and $I_{BIAS}$ may be established faster, thereby allowing the oscillator circuit to start faster. In these embodiments, after the oscillator has started, control circuit 270 may drive a lower voltage on node 272 to increase the time constant of the loop filter to prevent the amplitude regulation loop from becoming unstable.

As shown in FIG. 2, transistor 214 provides a variable resistance. In some embodiments, a variable resistor is implemented in a different manner. For example, in some embodiments, a variable resistance is provided by multiple resistors coupled in series or parallel with switches to include or remove the resistors from the loop filter circuit. The various embodiments of the present invention are not limited by the manner in which the variable resistance is implemented.

As shown in FIG. 2, the time constant of the loop filter is modified by changing the resistance of transistor 214. In some embodiments, the time constant of the loop filter is modified by changing the capacitance of capacitor 234. For example, capacitor 234 may include multiple capacitors that may be individually included or excluded from the circuit.

In some embodiments, amplitude detector 260 detects the oscillation amplitude present on node 211. For example, amplitude detector 260 may include a diode detector or any other type of circuit that is capable of detecting the amplitude of the oscillations on node 211. Amplitude detector 260 may also include a comparator to compare the amplitude to a threshold. For example, the oscillator circuit may be considered in a start-up mode when the amplitude is below a particular threshold, and may be considered in a normal operating mode when the amplitude is above the threshold. By comparing the detected amplitude to a threshold, amplitude detector 260 may determine when the oscillator circuit is to be transitioned from start-up mode to normal operating mode.

Amplitude detector 260 and control circuit 270 are part of a control mechanism to operate oscillator circuit 200 in either a start-up mode or an operating mode. Amplitude detector 260 receives feedback from the oscillator on node 211, and control circuit 270 receives information from amplitude detector 260. In some embodiments, the information received by control circuit 270 may include the detected amplitude. Also in some embodiments, the information received may include one or more digital signals representing the amplitude crossing one or more thresholds. In response to the information received from amplitude detector 260, control circuit 270 may manipulate the filter control signal on node 272 as described above, and may manipulate the bias control signal on node 274 as described below.

In addition to modifying the loop filter during the start-up of oscillator circuit 200, control circuit 270 may modify the bias resistance coupled to the source of transistor 210 to increase $I_{BIAS}$ during the start-up of oscillator circuit 200. For example, during start-up, control circuit 270 may cause switch 280 to close, thereby reducing the bias resistance, and increasing the bias current $I_{BIAS}$. When the bias current $I_{BIAS}$ is increased, $I_2$ is also increased, allowing the oscillator to start quickly. When the oscillator circuit has started, control circuit 270 may open switch 280, thereby decreasing the bias current $I_{BIAS}$. When the bias current is decreased, $I_2$ is also decreased, and the oscillator consumes less power.

Resistors 244 and 246 and switch 280 form a variable resistor that can affect the bias current $I_{BIAS}$. Oscillator circuit 200 is shown having two possible settings for the variable resistor coupled to the source of transistor 210. In some embodiments, many more possible settings exist for bias resistance. For example, multiple resistors and multiple switches may be arranged to provide different amounts of bias resistance. Multiple resistors of different values may be combined in series or parallel combinations to create changes in bias resistance of any type. For example, the bias resistance can be changed in linear steps, exponential steps, or in any other fashion. In some embodiments, the bias resistance may be changed in increments based on the oscillation amplitude crossing various thresholds.

Figure 3:
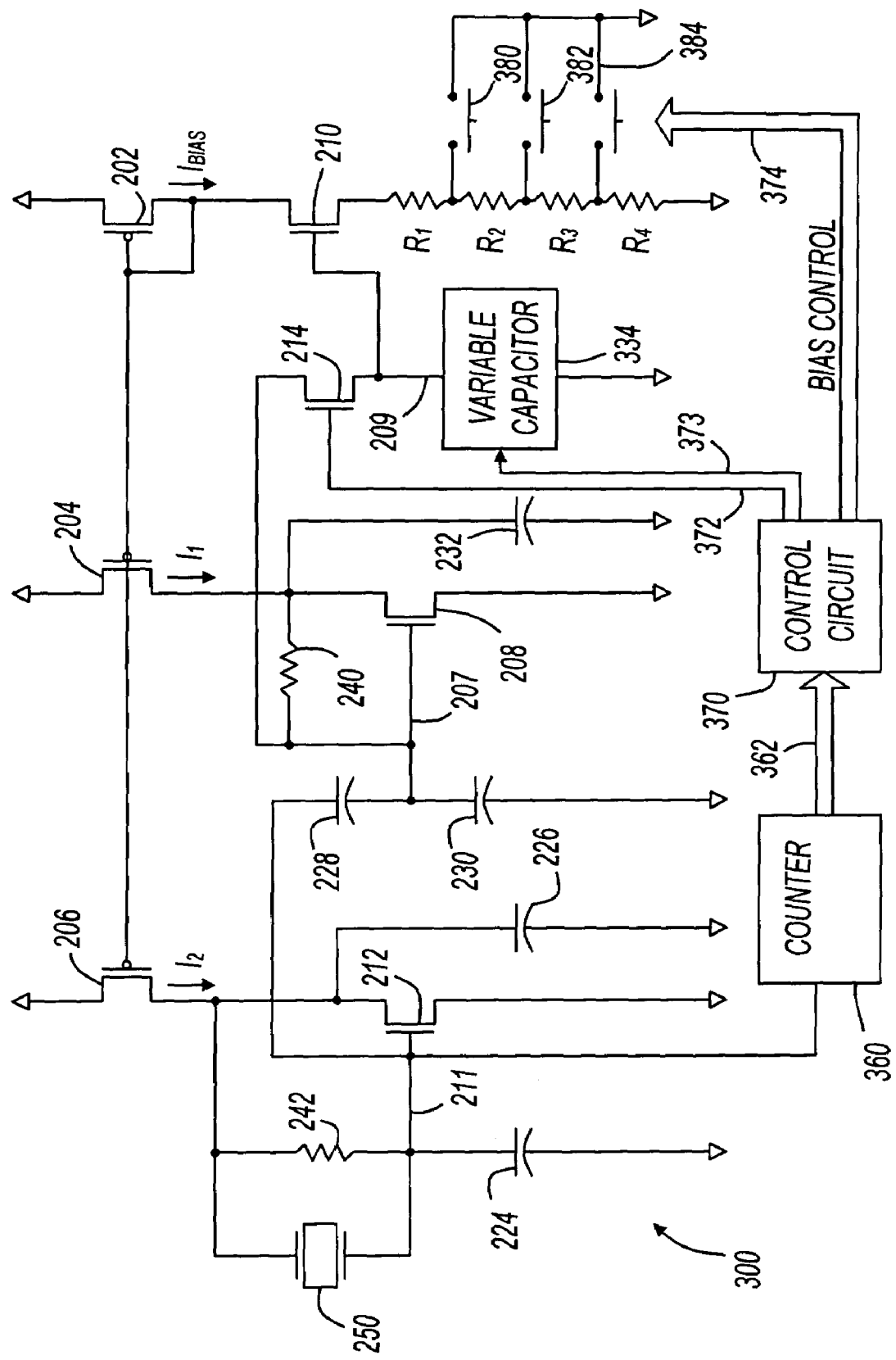

FIG. 3 shows a crystal oscillator circuit in accordance with various embodiments of the present invention. Oscillator circuit 300 includes many of the transistors and capacitors shown in FIG. 2. Also shown in FIG. 3 are counter 360 and control circuit 370. In various embodiments of the present invention, counter 360 counts the number of cycles of the oscillating signal on node 211, and provides a count value to control circuit 370 on signal nodes 362. In response to counter values provided on signal nodes 362, control circuit 370 manipulates one or more of the loop filter control signals on nodes 372 and 373 and manipulates the bias resistor control signals on nodes 374.

As shown in FIG. 3, oscillator circuit 300 includes variable capacitor 334 as part of the loop filter circuit. In some embodiments, variable capacitor 334 includes multiple capacitors and switches that are configured to either switch capacitors into the circuit, or switch capacitors out of the circuit. For example, variable capacitor 334 may include capacitors fabricated using gates of transistors, metal-insulator-metal (MIM) capacitors, or any other type of capacitor supported by the manufacturing processes employed. Also for example, switches may be implemented using transistors with a relatively low "on" resistance, and a relatively high "off" resistance.

The loop filter in FIG. 3 is shown having a variable resistive element (transistor 214) and a variable capacitor. In some embodiments, a variable resistor is employed with a fixed capacitor. In other embodiments, a variable capacitor is employed with a fixed resistor. Any combination of variable circuit elements may be utilized without departing from the scope of the present invention.

Oscillator circuit 300 is put into a start-up mode upon a starting event, and is put into an operating mode when an operating condition is met. In some embodiments, the operating condition may be represented by a time period. For example, counter 360 counts a time period that the oscillator is running by counting cycles of the oscillating signal, and control circuit 370 may detect when the time period crosses one or more predetermined thresholds. Control circuit 370 may then change the mode of the oscillating circuit.

In some embodiments, control circuit 370 detects when oscillator circuit 300 has been running for a predetermined period of time, and changes the loop filter control to provide a larger time constant as described above with reference to FIG. 2. Also in some embodiments, control circuit 370 may change bias control signals on nodes 374 to change the value of $I_{BIAS}$.

The variable resistor shown coupled to the source of transistor 210 in FIG. 3 includes four resistor segments instead of the two resistor segments shown in FIG. 2. Each resistor segment may be included or removed from the circuit through the action of switches 380, 382, and 384. The arrow shown at the end of signal nodes 374 is meant to indicate that signals on signal nodes 374 control switches 380, 382, and 384. Although four resistor segments and three switches are shown in FIG. 3, this is not a limitation of the present invention. For example, any number of resistor segments and any number of switches may be included in oscillator circuit 300.

Control circuit 370 may increase the bias resistance in steps by closing switches 380, 382, and 384 in a coordinated sequence. For example, when counter 360 reaches a first count value, control circuit 370 may close switch 384. When counter 360 reaches a second count value, control circuit 370 may close switch 382, and when counter 360 reaches a third count value, control circuit 370 may close switch 380.

In addition to modifying the bias resistance in increments, control circuit 370 may control the time constant of the loop filter in increments. For example, control circuit 370 may apply a high voltage on node 372 upon a start-up condition, and then may gradually reduce the voltage on node 372 as the count value increases, so as to increase the time constant of the loop filter gradually as the time of operation increases. In addition, control circuit 370 may change the time constant of the loop filter by incrementally changing a capacitance value of variable capacitor 334. In still further embodiments, control circuit 370 may modify both the resistance of transistor 214 and the capacitance of variable capacitor 334.

Oscillator circuits, control circuits, transistors, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, custom devices, or the like. Likewise, any embodiment of the present invention can also be represented as a hard macro targeted to a specific manufacturing process. For example, oscillator circuit 200 (FIG. 2) may be represented as polygons assigned to layers of an integrated circuit.

Figure 4:
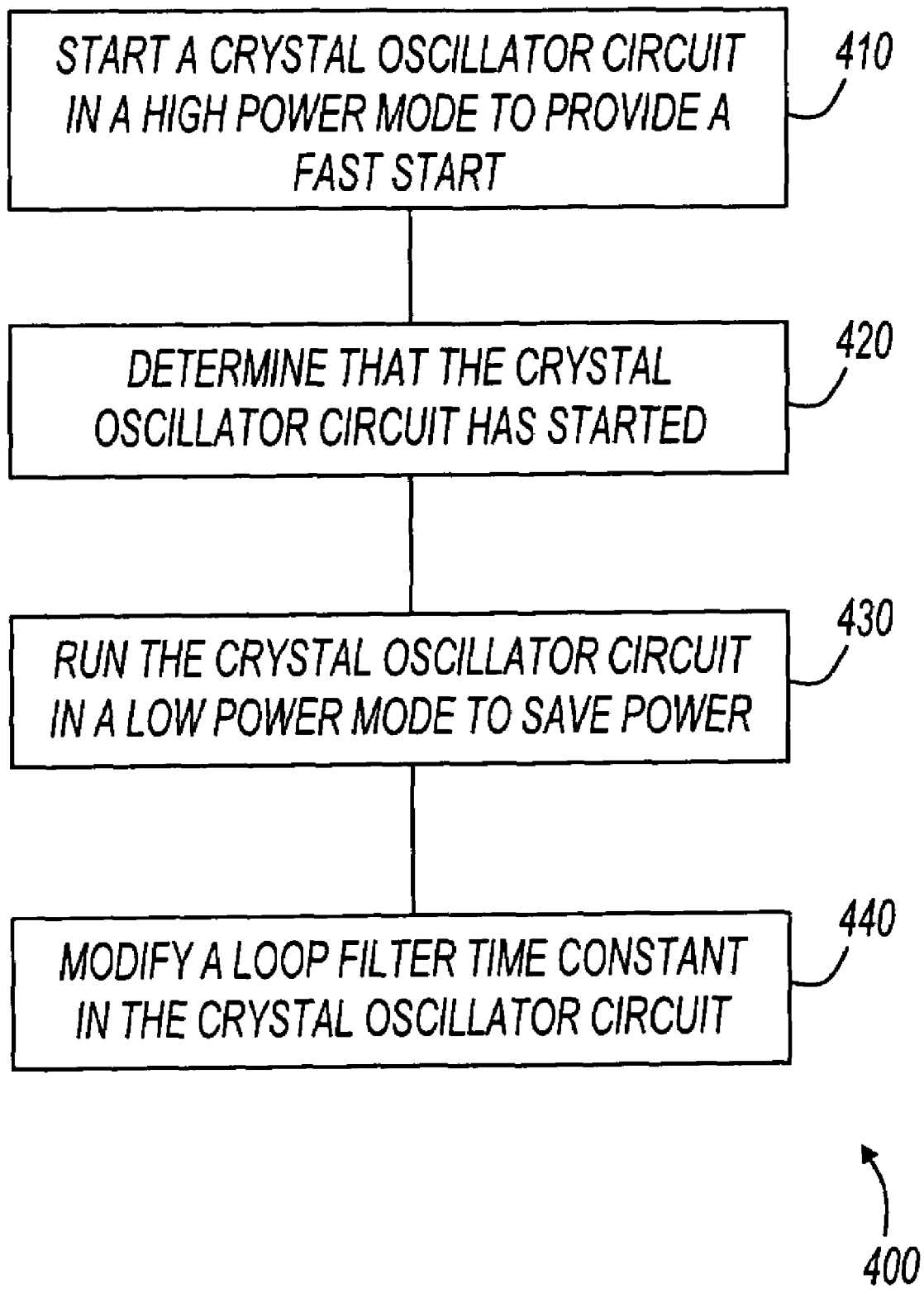
FIG. 4 shows a flowchart in accordance with various embodiments of the present invention.

FIG. 4 shows a flowchart in accordance with various embodiments of the present invention. In some embodiments, method 400 may be used in, or for, a crystal oscillator circuit. In some embodiments, method 400, or portions thereof, is performed by a start-up control circuit, embodiments of which are shown in the various figures. In other embodiments, method 400 is performed by an amplitude detector and control circuit, a counter and control circuit, or an electronic system. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 is shown beginning at block 410 in which a crystal oscillator circuit is started in a high power mode to provide a fast start. In some embodiments, this may correspond to reducing the resistance of a bias resistor in a bias current generator to increase the current provided to a gain device coupled to a crystal. For example, referring back to FIG. 2, control circuit 270 may reduce the value of the resistance coupled to the source of transistor 210 to increase $I_{BIAS}$. Further, in some embodiments, the acts of block 410 may also correspond to reducing the time constant of a loop filter as described above with reference to FIGS. 2 and 3.

At 420, method 400 determines whether the crystal oscillator circuit has started. In some embodiments, this corresponds to determining if an operating condition is met. For example, the operating condition may include an amount of time that the oscillator circuit has been operating, or may include an oscillation amplitude. At 430, the crystal oscillator circuit is run in a low power mode to save power. In some embodiments, this corresponds to increasing the value of a bias resistor to reduce a bias current and to reduce the current provided to a gain device coupled to a crystal.

At 440, a loop filter time constant is modified in the crystal oscillator circuit. In some embodiments, this corresponds to changing a gate voltage on a transistor that provides a resistance in an RC network. The time constant of the loop filter may be changed in one large step, or may be changed in smaller increments over time.

Figure 5:
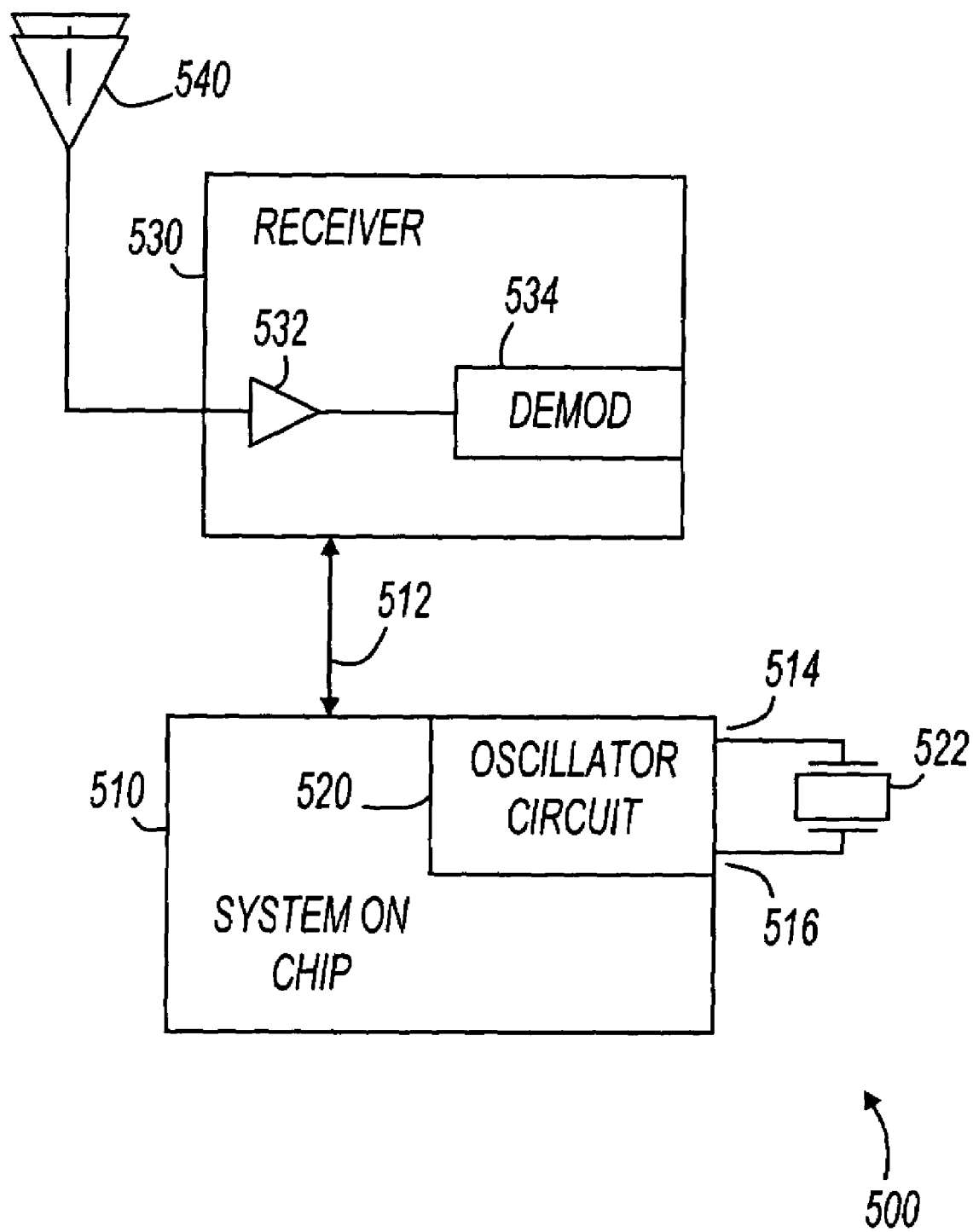
FIG. 5 shows an electronic system in accordance with various embodiments of the present invention.

FIG. 5 shows a system diagram in accordance with various embodiments of the present invention. FIG. 5 shows system 500 including system-on-chip (SOC) 510, receiver 530, and antennas 540. SOC 510 includes oscillator circuit 520 coupled to crystal 522 at electrical contacts 514 and 516. Oscillator circuit 520 may include any of the oscillator circuit embodiments represented by the previous figures. In some embodiments, SOC 510 is an integrated circuit that includes many components; however, as used herein, the term "system-on-chip" and the acronym "SOC" do not imply any particular level of integration. For example, in some embodiments, an SOC may include a processor and an oscillator circuit, or a peripheral device and an oscillator circuit.

In systems represented by FIG. 5, SOC 510 is coupled to receiver 530 by conductor 512. Receiver 530 receives communications signals from antennas 540 and also communicates with SOC 510 on conductor 512. In some embodiments, receiver 530 provides communications data to SOC 510. Also in some embodiments, SOC 510 provides control information to receiver 530 on conductor 512.

Example systems represented by FIG. 5 include cellular phones, personal digital assistants, wireless local area network interfaces, and the like. Many other systems uses for SOC 510 exist. For example, SOC 510 may be used in a desktop computer, a network bridge or router, or any other system without a receiver.

Receiver 530 includes amplifier 532 and demodulator (demod) 534. In operation, amplifier 532 receives communications signals from antennas 540, and provides amplified signals to demod 534 for demodulation. For ease of illustration, frequency conversion and other signal processing is not shown. Frequency conversion can be performed before or after amplifier 532 without departing from the scope of the present invention. In some embodiments, receiver 530 may be a heterodyne receiver, and in other embodiments, receiver 530 may be a direct conversion receiver. In some embodiments, receiver 530 may include multiple receivers. For example, in embodiments with multiple antennas 540, each antenna may be coupled to a corresponding receiver.

Receiver 530 may be adapted to receive and demodulate signals of various formats and at various frequencies. For example, receiver 530 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Antennas 540 may include one or more antennas. For example, antennas 540 may include a single directional antenna or an omni-directional antenna. As used herein, the term omni-directional antenna refers to any antenna having a substantially uniform pattern in at least one plane. For example, in some embodiments, antennas 540 may include a single omni-directional antenna such as a dipole antenna, or a quarter wave antenna. Also for example, in some embodiments, antennas 540 may include a single directional antenna such as a parabolic dish antenna or a Yagi antenna. In still further embodiments, antennas 540 include multiple physical antennas. For example, in some embodiments, multiple antennas are utilized for multiple-input-multiple-output (MIMO) processing or spatial-division multiple access (SDMA) processing.

Although SOC 510 and receiver 530 are shown separate in FIG. 5, in some embodiments, the circuitry of SOC 510 and receiver 530 are combined in a single integrated circuit. Furthermore, receiver 530 can be any type of integrated circuit capable of processing communications signals. For example, receiver 530 can be an analog integrated circuit, a digital signal processor, a mixed-mode integrated circuit, or the like.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An oscillator circuit comprising:
a bias current generator with a selectable current;
a loop filter with a variable time constant to influence an oscillation amplitude; and
a control circuit coupled to influence operation of the bias current generator and the loop filter.

2. The oscillator circuit of claim 1 wherein the loop filter includes a capacitor and a transistor to provide a resistance.

3. The oscillator circuit of claim 2 wherein the transistor includes a gate node coupled to vary the resistance of the transistor.

4. The oscillator circuit of claim 1 wherein the control circuit includes a counter to measure an amount of time since the oscillator circuit started.

5. The oscillator circuit of claim 4 wherein the counter is coupled to change the variable time constant when the amount of time has elapsed.

6. The oscillator circuit of claim 1 wherein the control circuit includes an amplitude detector to detect the oscillation amplitude.

7. The oscillator circuit of claim 1 wherein the bias current generator includes a variable resistor.

8. The oscillator circuit of claim 7 wherein the amplitude detector includes circuitry to modify the variable resistor when the oscillation amplitude reaches a threshold.

9. An integrated circuit comprising:
two electrical contacts to be coupled to a crystal;
a gain device to amplify oscillations from the crystal;
a control mechanism to operate the gain device in a start-up mode upon a starting event, and to operate the gain device in an operating mode after an operating condition is met; and a bias current generator having a variable bias resistor, wherein the variable bias resistor is influenced by the control mechanism.

10. The integrated circuit of claim 9 wherein the operating condition is a time of operation.

11. The integrated circuit of claim 10 wherein the control mechanism comprises a counter.

12. The integrated circuit of claim 9 wherein the operating condition is oscillation amplitude.

13. The integrated circuit of claim 12 wherein the control mechanism comprises an amplitude detector.

14. The integrated circuit of claim 9 wherein the start-up mode is a higher power mode than the operating mode.

15. An integrated circuit comprising:
two electrical contacts to be coupled to a crystal;
a gain device to amplify oscillations from the crystal;
a control mechanism to operate the gain device in a start-up mode upon a starting event, and to operate the gain device in an operating mode after an operating condition is met; and
a loop filter having a variable time constant, wherein the variable time constant is influenced by the control mechanism.

16. The integrated circuit of claim 15 wherein the loop filter includes a circuit element having a variable resistance influenced by the control mechanism.

17. The integrated circuit of claim 16 wherein the circuit element comprises a transistor.

18. The integrated circuit of claim 15 wherein the loop filter includes a circuit element having a variable capacitance influenced by the control mechanism.

19. A method comprising:
starting a crystal oscillator circuit in a high power mode to provide a fast start, wherein starting the crystal oscillator in a high power mode includes reducing a time constant of a loop filter;
determining that the crystal oscillator circuit has started; and
running the crystal oscillator in a low power mode to save power, wherein running the crystal oscillator in a low power mode includes increasing the time constant of the loop filter.

20. The method of claim 19 wherein starting comprises providing a large current to a gain device coupled to a crystal.

21. The method of claim 19 wherein determining that the crystal oscillator circuit has started comprises measuring a number of oscillations of the crystal oscillator circuit.

22. The method of claim 19 wherein determining that the crystal oscillator circuit has started comprises measuring an amplitude of oscillations.

23. An electronic system comprising:
an antenna;
a receiver coupled to the antenna; and
a system on a chip coupled to the receiver, wherein the system on a chip includes a crystal oscillator circuit having a gain device to amplify oscillations from a crystal, and a control mechanism to operate the gain device in a start-up mode upon a starting event, and to operate the gain device in an operating mode after an operating condition is met, and also including a bias current generator having a variable bias resistor, wherein the variable bias resistor is influenced by the control mechanism.

24. The integrated circuit of claim 23 wherein the control mechanism comprises a counter.

25. The electronic system of claim 23 wherein the control mechanism comprises an amplitude detector.

* * * * *